United States Patent
Nakayama et al.

[11] 3,988,621
[45] Oct. 26, 1976

[54] SUPPORTING STRUCTURE FOR A THICKNESS-SHEAR TYPE QUARTZ OSCILLATOR

[75] Inventors: Toshihiko Nakayama, Tokorozawa; Hiroshi Hishida, Sayama; Hisao Wakabayashi, Higashikurume; Hisao Yoshikawa, Tokorozawa; Isao Koyama, Kodaira, all of Japan

[73] Assignee: Citizen Watch Co., Ltd., Tokyo, Japan

[22] Filed: Dec. 4, 1974

[21] Appl. No.: 529,473

[30] Foreign Application Priority Data
Dec. 10, 1973 Japan............................ 48-141162
Sept. 16, 1971 Japan............................ 46-72019

[52] U.S. Cl.................................. 310/9.4; 310/8.5
[51] Int. Cl.²........................................ H01L 41/04
[58] Field of Search........................ 310/9.1–9.4, 310/8.9

[56] References Cited
UNITED STATES PATENTS

| | | | |
|---|---|---|---|
| 2,326,923 | 8/1943 | Bokovoy | 310/9.4 |
| 2,967,957 | 1/1961 | Massa | 310/9.4 |
| 3,137,836 | 6/1964 | Glover | 310/9.4 X |
| 3,173,035 | 3/1965 | Fisher | 310/9.4 X |
| 3,622,816 | 11/1971 | McGrew | 310/9.4 |
| 3,708,702 | 1/1973 | Brunnert et al. | 310/9.4 X |
| 3,746,898 | 7/1973 | Austin et al. | 310/9.4 |

*Primary Examiner*—Mark O. Budd
*Attorney, Agent, or Firm*—Holman & Stern

[57] ABSTRACT

The invention relates to a support structure for a thickness-shear mode, convex lens type oscillator.

The support structure contains an elastic ring made from an insulating material such as nylon. This ring is formed with a plurality of spaced, radially inwardly and integrally extending projections from the ring proper and said projections represent concentric recesses of opposite configurations one after another adapted for establishing pressure contact with the quartz crystal at their opposite surfaces and at different peripheral areas thereof.

3 Claims, 5 Drawing Figures

FIG. 3
FIG. 4
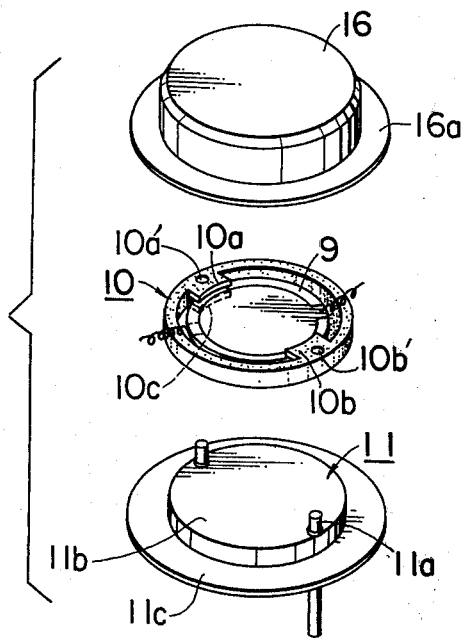
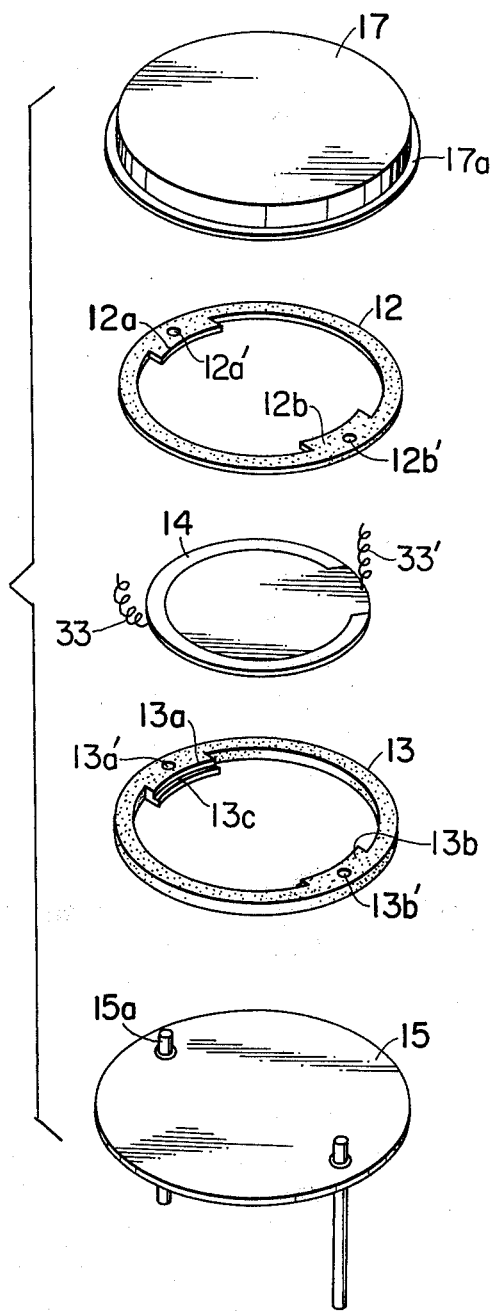

SUPPORTING STRUCTURE FOR A THICKNESS-SHEAR TYPE QUARTZ OSCILLATOR

BACKGROUND OF THE INVENTION

This invention relates to improvements in and relating to a supporting structure for a thickness-shear mode quartz crystal oscillator.

A representative conventional design of the supporting structure for a thickness-shear mode quartz crystal oscillator represents, as will be more fully described hereinafter, a pair of rather longer wire supports which rigidly support the convex lens type quartz crystal element at its two diametrally opposite peripheral points, the root ends of said wire supports being rigidly supported on a rigid ceramic or the like base plate and a hollow closed top case cap is slid-on to the latter, so as to provide a protecting case assembly for supporting the lens type oscillator element in a resiliently protecting manner.

This kind of conventional quartz cyrstal-supporting structure is liable to becoming unstable upon subjected to outside vibration and/or mechanical shocks, resulting in appreciable alteration in the crystal impedance and operating frequency characteristics.

In addition, rather large idle space may be required when fitting the conventional type quartz crystal supporting structure to an electronic watch.

SUMMARY OF THE INVENTION

It is therefore an object of the present invention to provide an efficient and improved quartz crystal-supporting structure highly durable to outside mechanical vibration and shock.

A further object is to provide the supporting structure of the above which is highly compact so that it may be fitted to an electronic watch or the like appliances.

These and further objects, features and advantages will become more apparent when read in conjunction with the following detailed description of several preferred embodiments of the present invention, by reference to the accompanying drawings illustrative of the embodiments.

BRIEF DESCRIPTION OF THE DRAWINGS

In the drawings:

FIG. 3 is a similar view to FIG. 2, illustrative, however, of a second embodiment of the invention.

FIG. 4 is a similar view to FIG. 2, illustrative, however, of a third embodiment of the present invention.

DETAILED DESCRIPTION OF THE INVENTION

In the following, several preferred embodiments of the invention will be illustrated in detail by reference to FIGS. 2 – 4 and in comparison with a conventional representative embodiment shown in FIG. 1.

Figure 1:
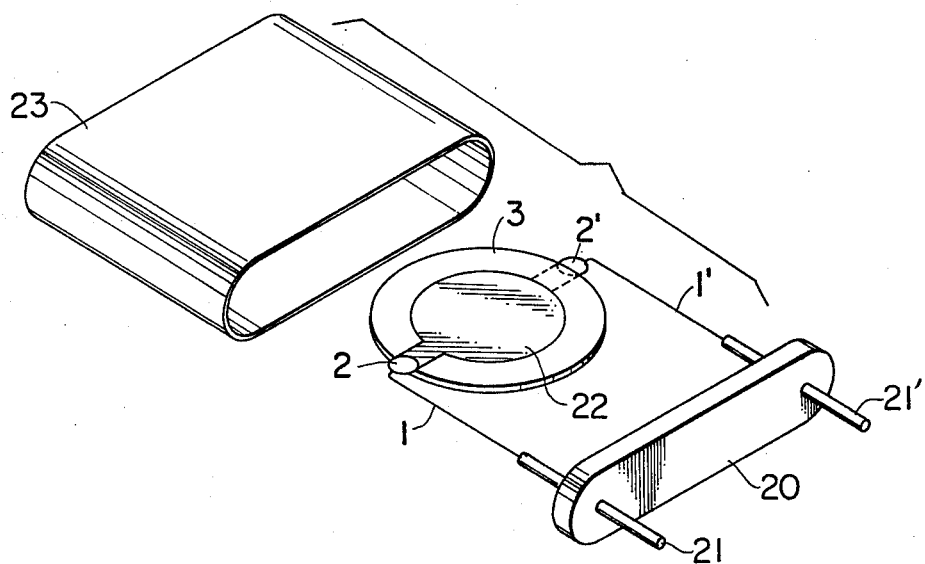
FIG. 1 is an exploded perspective view of a representative conventional quartz crystal-supporting structure.

A conventional design of the supporting structure of a thickness-shear type quartz oscillator which is generally shaped into a convex lens element is shown in FIG. 1. This supporting structure comprises a pair of supporting and conductive metallic wires 1 and 1' having coiled top ends 2 and 2', having each two or four loops for squeezing diametrally opposite points selected at the peripheral zones of the quartz crystal element 3 from its upper and bottom surfaces thereof. For assuring the fixation thereat, proper glueing agent such as epoxy resin, may preferably be applied to these coiled ends 2 and 2'.

The wire supports 1 and 1' are fixedly attached by their root ends to the upper ends of terminal leads 21 and 21', respectively, by soldering welding or the like conventional fixing technique, said lead passing fixedly through a ceramic or the like non-conducting base member 20 for conducting pulse current for pulsative energization of a pair of piezoelectric electrode elements as at 22, stuck onto both surfaces of the quartz crystal oscillator element 3. An elongate hollow metallic case 23, preferably closed at its top end although not shown, is assembled with the base 20 into one rigid assembly for the protection of the quartz crystal-electrodes unit, as may be well supposed from the drawing although not shown specifically.

Such conventional quartz crystal-supporting structure could well serve for the communication purpose. However, if such structure be used in watches for the support of a miniatured quartz crystal oscillator, the latter could be adversely affected in its crystal impedance and permanent frequency stability on account of the likelihood of being unstable for outside vibration, shocks and the like mechanical and physical influences. In addition, such conventional structure will provide an excess idle space formed between the quartz crystal and the protecting case, thus giving rise to a rather voluminous structure as a whole.

Now, referring to FIG. 2, the first embodiment of the invention will be described in detail.

In the drawing, numeral 4 represents a lens type quartz crystal oscillator element of the thickness shear mode as was specifically mentioned with that shown at 3 in FIG. 1. Numeral 5 represents a ring shaped supporting ring which has been molded or punched-out from a resilient and insulating material such as, preferably, hard rubber, semi-hard plastics or the like, adapted for supporting said oscillator element 4, as will become more apparent as the description proceeds.

Figure 2:
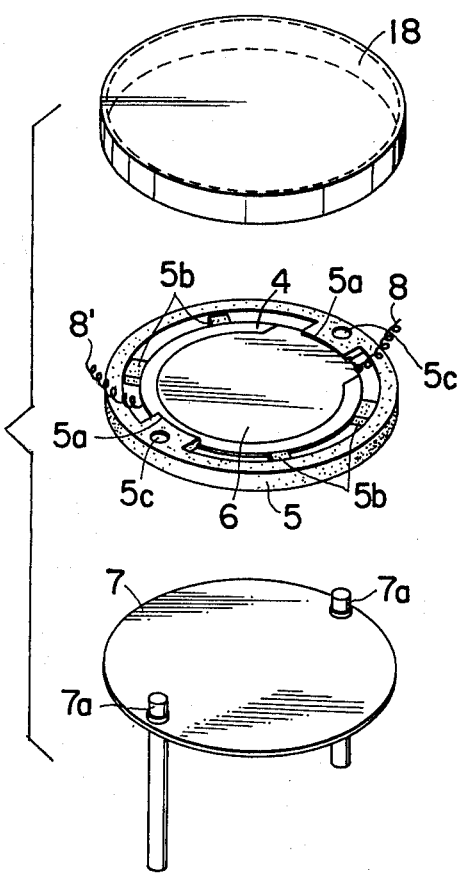
FIG. 2 is an exploded perspective view of a first embodiment of the quartz crystal-supporting structure according to the present invention.
Figure 2A:
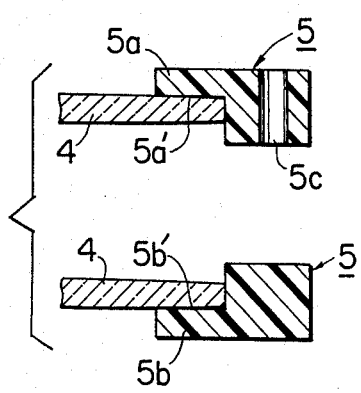
FIG. 2a represents two separate cross-sections of an elastic support ring which constitutes a member of the structure shown in FIG. 2.

From the inner periphery of the elastic ring 5, a plurality of supporting resilient projections 5a and 5b radially inwardly extend, as shown most clearly in FIG. 2a. These radial projections 5a and 5b are arranged at regular circumferential gap distances concentrically and alternately. Each of the first kind projections 5a is formed with a downwardly and radially inwardly opening angular circumferential concentric groove 5a', for establishing a pressurized resilient contact with the upper circumpherential surface of the lens element 4 upon slight elastic deformation, as most clearly and enlargedly shown in section at the left-hand side view of FIG. 2a. In the similar way, each of the second kind projections 5b is formed with an upwardly and radially inwardly opening eccentric angular circumferential groove 5b', for establishing a pressurized resilient contact with the lower circumferential surface of the lens element 4 upon slight elastic deformation, as most clearly and enlargedly shown in section at the right-hand side view of FIG. 2a. In this way, the lens element 4 is firmly, yet slightly elastically supported by these projections 5a and 5b at its both upper and lower surfaces, for establishing and maintaining its designated position. If necessary, the supporting ring 5 may be made of "Teflon", nylon or the like resilient material. These supporting projections 5a and 5b with respective lens-positioning grooves 5a' and 5b' are not axially overlapped, but their opening directions of the latter are in opposition to each other when seen in the axial direction of the ring 5.

In order to assemble the lens crystal element 4 with the supporting ring 5 for proper and slightly resilient positioning of the former, it may be easily carried out by flexing the latter by applying a manual force upon provisionally and concentrically positioning of the both in their mutually contacting state and applying an axial manual pressure thereto, and until the peripheral area of the lens element 4 is caught by the supporting projections 5a and 5b one after another. By releasing the flexing manual force, the flexed ring 5 will recover its normal plane shape for properly and resiliently support of the lens member 4, as shown at the middle of FIG. 2.

The lens member 4 is attached fixedly and concentrically as before at its both surfaces with a pair of energizing piezoelectric electrodes as at 6.

Numeral 7 represents an air tight cover disc made of a hard non-conducting material, preferably ceramic, and attached fixedly with a pair of conductive terminal posts, arranged diametrally opposite as shown and represented by a common reference numeral 7a, the upper heads of these posts passing through the material of said cover disc 7 and respective air-tight reception openings 5c formed through a related pair of said projections 5a, when the cover disc has been assembled together to the ring 5 from the bottom thereof. The terminal heads may slightly project through the respective reception openings 5c and be attached fixedly with outer extremities of fine leads 8 and 8' extending from diametrally opposite portions of the electrodes 6, by conventional fixing means such as spot welding, soldering, thermal pressing or the like.

Numeral 18 is a top cover cap closed at its top end and opened at its bottom end, as may well seen from FIG. 2. This cover cap 18 may be of metal or an insulating material such as ceramic, plastics or the like.

The cover cap 18 may be assembled together with the cylindrical periphery of supporting ring 5 or alternatively with the peripheral edge of the cover disc 7 or both, according to the relative diametral and peripheral dimensions of the cover cap 18 and the closure disc 7. When the diameter of disc 7 is slightly larger than the support ring 5, the disc is fixedly and sealingly attached to the bottom surface of the ring 5 by glueing by use of epoxy resin or the like conventional sticking agent. Then, the cap 18 may be slid on and sealingly attached with the disc which has been applied into its peripheral edge with epoxy resin or the like sticking agent. When the diameter of the disc 7 is equal to that of the ring 5, the cap 18 may be attached jointly to the both members 5 and 7. If the diameter of the disc is smaller than that of the ring 5, the cap 18 may be attached only with the ring 5. Glueing procedures may naturally be employed as before. However, for the protection of the mechanical oscillator 5; 6 from adverse effects of atmospheric moisture and/or foreign particles, substantial part of the above glueing jobs may be dispensed with, by fabricating the main parts of the structure 5; 7; 18 to precise dimensions, if necessary.

In FIG. 3, the second embodiment of the invention is shown.

In this embodiment, 9 represents a convex lens mode thickness-shear type quartz crystal oscillator element as before, which is fitted with a pair of opposedly arranged piezoelectric energizing electrodes in the same manner as before, although its analysis has been omitted for simplicity. Numeral 10 represents a support ring made of an insulating elastic material as before, a pair of diametrally opposite, inwardly directing support projections 10a and 10b being formed on the inner periphery of said ring. Each of these projections 10a and 10b is formed at its inner and lower edge portion with a concentric and angular recess 10c which may be similar with that denoted 5a in the foregoing, for positional reception of peripheral portion of the lens element 10 as before. These projections 10a and 10b are formed with respective perforations 10a' and 10b', respectively, adapted for snugly receiving the upper exposing heads of a pair of terminal posts at 11a which is similar to those shown at 7a in the foregoing.

Numeral 11 represents an air-tight closure disc which is similar in its general function with that shown at 7 in the foregoing. The modified closure disc 11 from the foregoing one 7 comprises, however, a circular main disc portion 11b and a stepped and concentric flange portion 11c, instead of a plain disc. When assembled together three members 10; 11 and 16 of the crystal supporting structure, the last numeral 16 representing a modified closure cap from the foregoing cap 18, the main portion 11b of the closure disc 11 serves for firmly positioning the lens element 9 from below by urging the latter against said reception recesses 10c on the supporting projections 10a and 10b. The modification of the closure cap 16 resides susbstantially in the provision of an integrally stepped ring flange portion 16a which is adapted for cooperation with the mating flange 11c when assembled together. The assembly of the closure disc 11 and cap 16 with the sub-assembly 9; 10 as an intermediate piece placed therebetween may be executed by establishing a tight engagement of said both flanges, by such as bolting screwing, spot welding, soldering or glueing between or at their mating surfaces. However, the most simple assembly job may be attained by assemblying the three main constituents shown in FIG. 3 under pressure, so as to seal the oscillator off in a substantially or perfectly air-tightly closed space.

In the third embodiment shown in FIG. 4, the crystal-support ring has been divided into two rings 12 and 13. The first ring 12 is formed with a pair of plain concentric projections 12a and 12b, having each a terminal head-reception opening 12a' or 12b'. The second ring 13 is formed with corresponding two concentric projections 13a and 13b, having concentric recesses at 13c and respective terminal-reception openings 13a' and 13b' to be in registration with said similar openings 12a' and 12b', respectively, when assembled together. Each of the said recesses 13c opens upwardly and inwardly as at 10c in foregoing. However, if necessary, the foregoing recesses 10c may be modified into channel grooves, although not shown.

The air-tight closure disc 15 is same in its structure and function with those of the foregoing disc shown at 7 in FIG. 2. The terminal posts are shown representatively with 15a.

Numeral 14 represents a quartz crystal oscillator element is similar to that shown at 3, 4 or 9 in the foregoing, thus being same as the conventionally designed one. This element 14 is squeezed by and between the said frist and second support rings 12 and 13 for firmly, yet slightly elastically held in position.

These three elements 12, 13 and 14 are firstly assembled together, so as to provide a subassembly, to which the closure disc 15 is attached firmly from below, by inserting the exposed upper heads of terminal posts 15a snugly inserting into first hole series 12a; 13a and 12a'; 13a', respectively. By attaching the outer extremities of connecting leads 33 and 33' to the heads of the thus assembled terminal posts 15a.

Numeral 17 is a top cap which has been designed into an upper closed, lower opened shell having a small, stepped and concentric ring flange 17a and adapted for mating with the closure disc 15 in a push-on tight mode when assembled together. This push-on tight structure may be employed rather preferably also in the foregoing first and second embodiments.

Rather preferably, the cap member 17 and or closure disc 15 may be made of quartz crystal material. This structure may be employed also in the foregoing first and second embodiment in a rather preferable way.

By adopting the foregoing structural principles of the invention, providing a unique quartz crystal supporting structure, the connection leads may be attached with the respective piezoelectric electrodes without use of conductive paste, or at least only a small amount of the latter may be used for providing the necessary connection with the electrodes, because the final assembly may be subjected to lesser degree of outside mechanical shocks by virtue of the elastic positioning and supporting of the quartz crystal oscillator. Naturally, the said lead connection may be carried out by reliance with thermal bond, ultrasonic welding or the like high efficiency attaching technique.

In this way, the crystal impedance and permanent frequency characteristics can be highly stabilized and regenerated among a large number of mass-production watches. These characteristics may be highly improved for electronic digital watches, according to our practical experiences.

According to our experimental data of watch drop tests from one meter height, variation in the operational frequency has been varied only less than 1 ppm which means, indeed, a remarkable result.

When necessary, the supporting ring may be made from plastics or metallic material. In the former case, it can be fabricated on a large mass production scale by reliance on the molding technique. In the latter case, the whole manufacturing process may be performed by reliance substantially or completely on the press job. Thus, the manufacturing efficiency can be substantially improved.

Space economy may naturally be attained for the quartz crystal oscillator contained and supported in a highly condensed way in the assembled case.

The embodiments of the invention in which an exclusive property or privilege is claimed are as follows:

1. A thickness-shear type quartz crystal oscillator-supporting structure comprising an elastic ring, said ring being formed with a plurality of spaced, radially inwardly and integrally extending projections from said ring, said projections representing concentric recesses of opposite configurations one after another adapted for establishing pressure contact with said quartz crystal at their opposite surfaces and at different peripheral areas thereof, said projections include at least one pair of diametrically arranged projections, each of which is formed with a downwardly and radially inwardly opening angular circumferential groove, for establishing contact with the upper circumferential surface of said quartz crystal, and wherein said projections further include at least one pair of diametrically arranged projections, each of which is formed with an upwardly and radially inwardly opening angular circumferential groove, for establishing contact with the lower circumferential surface of said quartz crystal.

2. A thickness-shear type quartz crystal oscillator-supporting structure comprising an elastic ring, said ring being formed with a plurality of spaced, radially inwardly and integrally extending projections from said ring, said projections representing concentric recesses of opposite configurations one after another adapted for establishing pressure contact with said quartz crystal at their opposite surfaces and at different peripheral areas thereof, said projections include a pair of diametrically arranged inwardly directed projections, each of which is formed at its inner and lower edge portion with a concentric and angular recess for reception of said quartz crystal.

3. A thickness-shear type quartz crystal oscillator-supporting structure comprising an elastic ring, said ring being formed with a plurality of spaced, radially inwardly and integrally extending projections from said ring, said projections representing concentric recesses of opposite configurations one after another adapted for establishing pressure contact with said quartz crystal at their opposite surfaces and at different peripheral areas thereof, said ring comprises an upper ring element having a pair of diametrically arranged inwardly extending projections and a lower ring element having a pair of diametrically arranged inwardly extending projections, each of the projections of the lower ring element including a concentric recess which opens upwardly and inwardly.

* * * * *